(12) United States Patent  (10) Patent No.: US 6,369,736 B2
Tran et al.  (45) Date of Patent: Apr. 9, 2002

(54) DATA CONVERTER WITH VERTICAL RESISTOR MEANDER

(75) Inventors: Hiep V. Tran, Dallas, TX (US); Shivaling S. Mahant-Shetti, Karnataka (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/740,302

(22) Filed: Dec. 18, 2000

Related U.S. Application Data

(60) Provisional application No. 60/172,759, filed on Dec. 20, 1999.

(51) Int. Cl.[7] .............................. H03M 1/66; H03M 1/78
(52) U.S. Cl. ........................................ 341/144; 341/154
(58) Field of Search ................................ 341/154, 145, 341/148, 156, 144, 163; 327/530, 67, 65

(56) References Cited

U.S. PATENT DOCUMENTS

| | | | | |
|---|---|---|---|---|
| 4,070,650 A | * | 1/1978 | Ohashi et al. | 341/154 |
| 5,673,223 A | * | 9/1997 | Park | 365/185.17 |
| 5,717,396 A | * | 2/1998 | Gross, Jr. et al. | 341/166 |
| 5,841,382 A | * | 11/1998 | Walden et al. | 341/144 |
| 5,999,115 A | * | 12/1999 | Connell et al. | 341/145 |
| 6,037,889 A | * | 3/2000 | Knee | 341/154 |
| 6,239,731 B1 | * | 5/2001 | Fattaruso et al. | 341/144 |

* cited by examiner

*Primary Examiner*—Peguy Jeanpierre
*Assistant Examiner*—Jean Bruner Jeanglaude
(74) *Attorney, Agent, or Firm*—W. James Brady; Frederick J. Tekecky, Jr.

(57) ABSTRACT

A data converter (20) comprising an input ($I_0'-I_3'$) for receiving a digital word and an output ($V_{OUT2}$) for providing an analog voltage level in response to the digital word. The data converter further comprises a plurality of bit lines (BL0'–BL3') formed with an alignment in a first dimension and a plurality of word lines (WL0'–WL4') formed with an alignment in a second dimension different than the first dimension. Further, the data converter comprises a string (12') comprising a plurality of series connected resistive elements (R0'–R14'). The string comprises a plurality of voltage taps (T0'–T15'), and at least a majority of the plurality of series connected resistive elements are formed with an alignment in the first dimension. The data converter also comprises a plurality of switching transistors (ST0'–ST15') coupled between the plurality of voltage taps and the output. Lastly, for each of a majority of the plurality of word lines the word line is coupled to at least one gate of a switching transistor located on a first side of the word line and to at least one gate of a switching transistor located on a second side of the word line, wherein the second side is opposite the first side.

21 Claims, 6 Drawing Sheets

US 6,369,736 B2

1

DATA CONVERTER WITH VERTICAL RESISTOR MEANDER

This application claims priority under 35 USC § 119(e)(1) of provisional application number 60/172,759 filed Dec. 20, 1999.

BACKGROUND OF THE INVENTION

The present embodiments relate to data converters, and are more particularly directed to converters using resistor strings.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal. Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Typically, the overall string is biased at opposing ends by two different reference voltages, where for example one such voltage is a positive voltage and the other is ground. Also in this regard, in an effort to maintain the linearity between the digital input and the analog output, a common concern in the art is to endeavor to ensure that each resistor in the string has as close to the same resistance value as all other resistors in the string. Accordingly, the resistor string forms a series voltage dividing network and each of the voltage taps is accessible as part of the operation for the data conversion (i.e., either from digital to analog, or analog to digital).

For further background to converters and by way of example, FIG. 1 illustrates a typical configuration of a prior art DAC 10, and is detailed briefly below. In addition, since the primary focus of the preferred embodiments described later is directed to resistor strings as used in either a DAC or an ADC, the following discussion provides one example of such a string as used in a DAC, but is not unduly lengthened by also providing a detailed analysis of an ADC. Instead, such an understanding is left to one skilled in the art.

FIG. 1 illustrates a typical configuration of a prior art DAC 10, and is detailed briefly here with additional detail ascertainable by one skilled in the art. By way of example and as appreciated later, DAC 10 is a 4-input 16-output DAC, while numerous other dimensions may exist for different DAC configurations. In general and as detailed below, DAC 10 is operable to receive a 4-bit input word, designated from least significant bit to most significant bit as $I_0$–$I_3$, and in response to the magnitude of that input to output a corresponding analog voltage. Before detailing this operation, it is first instructive to examine the devices and connections of DAC 10. In this regard, DAC 10 includes a series-connected resistor string designated generally at 12, and which forms a meander in that it serpentines back and forth. Additionally, DAC 10 is generally an array in nature, having a number of bit lines in the vertical dimension and a number of word lines in the horizontal dimension, and with repeated device patterns thereby forming cells in the array. Since the example of DAC 10 presents a 4-input 16-output

2

DAC, the array of DAC 10 includes four bit lines BL0 through BL3, and four word lines WL0 through WL3. Also for the current example of a 4-to-16 DAC, resistor string 12 includes fifteen resistive elements R0 through R14 formed in the horizontal dimension. Resistive elements R0 through R14 may be formed using various techniques as discussed in greater detail later, where regardless of the technique used to form the resistive elements ideally each resistive element has as close to the same resistance value as all other resistors in the string. Moreover, a voltage source $V_{REF1}$ is applied across resistor string 12, and may be of any suitable biasing voltage, which for current applications is typically on the order of 2.0 volts. For DAC 10, string 12 is biased between $V_{REF1}$ and ground, but it should be understood that in other configurations two different non-ground potentials may be connected at opposing ends of string 12. When ground is connected to one end of the string, it is easily appreciated that this difference of the potentials at the ends of the string equals $V_{REF1}$. In any event, given the equal resistance of each element in the string, $V_{REF1}$ is uniformly divided across the resistive elements of string 12.

Looking to the detailed connections with respect to resistive elements R0 through R14, each resistive element provides two taps from which a voltage may be measured as detailed below. For example, looking to resistive element R0, it provides a tap T0 and a tap T1, while resistive element R1 shares the same tap T1 and provides another tap T2, and so forth. Each tap has a switching device connected between it and a corresponding output bit line. In the current example, each of these switching devices is an n-channel field effect transistor, and is labeled for convenience by combining the abbreviation ST (i.e., switching transistor) with the same numeric identifier corresponding to the tap to which a source/drain of the transistor is connected. For example, a source/drain of transistor ST0 is connected to tap T0, a source/drain of transistor ST1 is connected to tap T1, and so forth. Further, the switching transistors are arranged so that a like number of taps are coupled via corresponding switching transistors to a corresponding one of the bit lines. In the current example of DAC 10, four taps are coupled in this manner to a corresponding bit line. For example, taps T0 through T3 are coupled, via corresponding switching transistors ST0 through ST3, to bit line BL0. As another example, taps T4 through T7 are coupled, via corresponding switching transistors ST4 through ST7, to bit line BL1. Each bit line BL0 through BL3 is coupled via a respective column access transistor, CAT0 through CAT3, to a column decoder 14. More particularly and for reasons evident below, column decoder 14 is coupled to receive the two most significant bits (MSBs) of the 4-bit word input to DAC 10, and in response column decoder 14 controls the gates of column access transistors CAT0 through CAT3. Lastly, it should be understood that column decoder 14 operates in response to an overall system supply voltage $V_{S1}$ which in the prior art is typically on the order of 5.0 volts.

Returning now to switching transistors ST0 through ST15, and given the array nature of DAC 10, it is further appreciated that the switching transistors are arranged so that a like number of switching transistors are controlled, via connection to their gates, by a corresponding word line which is further connected to row decoder 16. Like column decoder 14, row decoder 16 is also responsive to the system supply voltage $V_{S1}$. Returning to the connectivity between row decoder 16 and the switching transistors, and given the current example of DAC 10, the gates of four switching transistors are coupled to each corresponding word line. For example, the gates of switching transistors ST0, ST7, ST8, and ST15 are coupled to word line WL0. As another example, the gates of switching transistors ST1, ST6, ST9, and ST14 are coupled to word line WL1. Lastly in this regard, and for reasons evident below, row decoder 16 is coupled to receive the two least significant bits (LSBs) of the 4-bit word input to DAC 10 (i.e., bits $I_1$ and $I_0$), and is also controlled in response to the least significant bit ("lsb"), $I_2$, of the two MSBs input to column decoder 14. More particularly, each least significant bit $I_0$ and $I_1$ is coupled as an input to a corresponding exclusive OR gate EOG0 and EOG1 as a first input, while the second input of exclusive OR gates EOG0 and EOG1 is connected to receive $I_2$ (i.e., the least significant bit of the two MSBs input to column decoder 14). In response to these bits, row decoder 16 controls the gates of switching transistors ST0 through ST15 as detailed below.

The operation of DAC 10 is now described, first in general and then more specifically through the use of a few examples. A 4-bit digital word is connected to inputs $I_0$ through $I_3$ and ultimately causes signals to pass to column decoder 14 and row decoder 16. Generally, row decoder 16 includes sufficient logic circuitry or the like to respond by asserting one of word lines WL0 through WL3, thereby providing an enabling voltage to the gates of the four switching transistors coupled to the asserted word line. Similarly, column decoder 14 includes sufficient logic circuitry or the like to respond by enabling one of column access transistors CAT0 through CAT3, thereby causing the enabled transistor to pass the voltage from the corresponding one of bit lines BL0 through BL3 to output $V_{OUT1}$. In a simple case, the result of the above operations may be viewed by correlating the value of the 4-bit input to one of the sixteen decimal tap numbers. For example, if the 4-bit digital word equals 0001 (i.e., decimal value one), then DAC 10 enables a switching transistor and a column access transistor to couple the voltage at tap T1 to $V_{OUT1}$.

By way of detailed illustration of the operation of DAC 10, the example of an input equal to 0001 is now traced through DAC 10 in greater detail. From the input of 0001, its two MSBs are coupled to column decoder 14 and, thus, the value of 00 is received by column decoder 14. In response, column decoder 14 enables the gate of the column access transistor having a numeric identifier equal to the value of the MSBs. Here, the MSBs of 00 equal a decimal value of zero and, thus, column decoder 14 couples a voltage of $V_{S1}$ to the gate of column access transistor CAT0, thereby enabling that transistor. Turning now to row decoder 16, it responds to the value of the two LSBs of the 4-bit input. However, note that these two LSBs pass through exclusive OR gates and, therefore, their values are unchanged when passed to row decoder 16 if the lsb equals 0, or their complements are passed to row decoder 16 if the lsb equals 1. Returning then to the example of a 4-bit input equal to 0001, the two LSBs equal 01 and the lsb of the two MSBs equals 0. Thus, the unchanged LSBs equal to 01 reach row decoder 16, and row decoder 16 in response asserts the word line having a decimal numeric identifier equal to the value of the two LSBs as received from gates EOG0 and EOG1. In the present example, therefore, row decoder 16 asserts word line WL1 high to a value of $V_{S1}$ which, therefore, enables each of switching transistors ST1, ST6, ST9, and ST14. Recall also that column decoder 14 in this example enables column access transistor CAT0. As a result, the voltage from tap T1 passes via switching transistor ST1 to bit line BL0, and then passes via column access transistor CAT0 to $V_{OUT1}$. Lastly, it is noted that the voltage at tap T1 is divided across one resistive element (i.e., R0) and, thus, for an input equal to 0001, the analog output voltage using voltage division is $\frac{1}{15}*V_{REF1}$.

To further illustrate in detail the operation of DAC 10, consider now the example of an input equal to 0111 as traced through DAC 10. At the outset, from the general operation described above, one skilled in the art will expect that since the decimal value of 0111 equals seven, then the tap selected by DAC 10 for output is tap T7. This expectation is now confirmed through a detailed examination of this example. From the input of 0111, its two MSBs of 01 are coupled to column decoder 14. In response, column decoder 14 enables the gate of the column access transistor having a decimal numeric identifier equal to the two MSB values of 01 and, hence, the gate of column access transistor CAT1 is enabled. Turning now to row decoder 16, note first that the lsb of the two MSBs in this example equals one; consequently, gates EOG0 and EOG1 cause the complements of the two LSBs to reach row decoder 16. Thus, the complements of the 11 LSBs are 00 and, therefore, the value of 00 reaches row decoder 16. In response, row decoder 16 asserts word line WL0 high since that word line has a numeric identifier equal to the value of the two complemented LSBs. When word line WL0 is asserted, it enables each of switching transistors ST0, ST7, ST8, and ST15. Recall also that column decoder 14 in this example enables column access transistor CAT1. As a result, the voltage from tap T7 passes via switching transistor ST7 to bit line BL1, and then passes via column access transistor CAT1 to output $V_{OUT1}$. Lastly, it is noted that the voltage at tap T7 is divided across seven of the fifteen resistive elements (i.e., R0 through R6) and, thus, for an input equal to 0111, the analog voltage output using voltage division is equal to $\frac{7}{15}*V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 10 may be enabled along with enabling one of the column access transistors, and for each such combination of transistors there is a corresponding output which represents a divided voltage between zero volts or any value incrementing up from zero volts by $\frac{1}{15}V_{REF1}$ (assuming equal resistance among the resistive elements), and up to an output equal to $V_{REF1}$.

Having detailed DAC 10, attention is now focused in greater detail to resistive elements R0 through R14. Specifically, in the prior art such elements are often formed as metal devices in an effort to achieve considerably low resistance for reasons such as achieving various device speeds. For example, a single metal resistive element may have a resistance on the order of sixty milliohms per square and may support device speeds on the order of hundreds of megahertz. However, it has been observed in connection with the present inventive embodiments that various configurations do not require such small resistance values, where such configurations may well arise in devices operating at lower frequencies. In addition, it is often the goal of an integrated circuit to be made smaller, and this goal may well apply to a DAC, either alone or in combination with other circuitry on the same single integrated circuit. However, the present inventors recognize that the relatively larger size of metal resistive elements may conflict with the goal of reducing DAC size, or at least may complicate the efforts of obtaining such a goal without an inventive layout to accommodate those resistors. Accordingly, the present inventors recognize as developed below in the preferred embodiments that by either avoiding metal resistive elements or by providing an alternative cell layout some of the area and complexities that accompany such devices also may be reduced or substantially eliminated. In view of these drawbacks and goals, there arises a need to provide an improved converter configuration, as is achieved by the preferred embodiments discussed below.

BRIEF SUMMARY OF THE INVENTION

In the preferred embodiment, there is a data converter comprising an input for receiving a digital word and an output for providing an analog voltage level in response to the digital word. The data converter further comprises a plurality of bit lines formed with an alignment in a first dimension and a plurality of word lines formed with an alignment in a second dimension different than the first dimension. Further, the data converter comprises a string comprising a plurality of series connected resistive elements. The string comprises a plurality of voltage taps, and at least a majority of the plurality of series connected resistive elements are formed with an alignment in the first dimension. The data converter also comprises a plurality of switching transistors coupled between the plurality of voltage taps and the output. Lastly, for each of a majority of the plurality of word lines the word line is coupled to at least one gate of a switching transistor located on a first side of the word line and to at least one gate of a switching transistor located on a second side of the word line, wherein the second side is opposite the first side. Other circuits, systems, and methods are also disclosed and claimed.

BRIEF DESCRIPTION OF THE SEVERAL VIEWS OF THE DRAWING

FIG. 3b illustrates a plan view of the cell from the DAC of FIG. 2, but at an earlier step in the manufacturing process than in FIG. 3a.

FIG. 3c illustrates a cross sectional view of a resistive element from FIG. 3a.

DETAILED DESCRIPTION OF THE INVENTION

Figure 1:
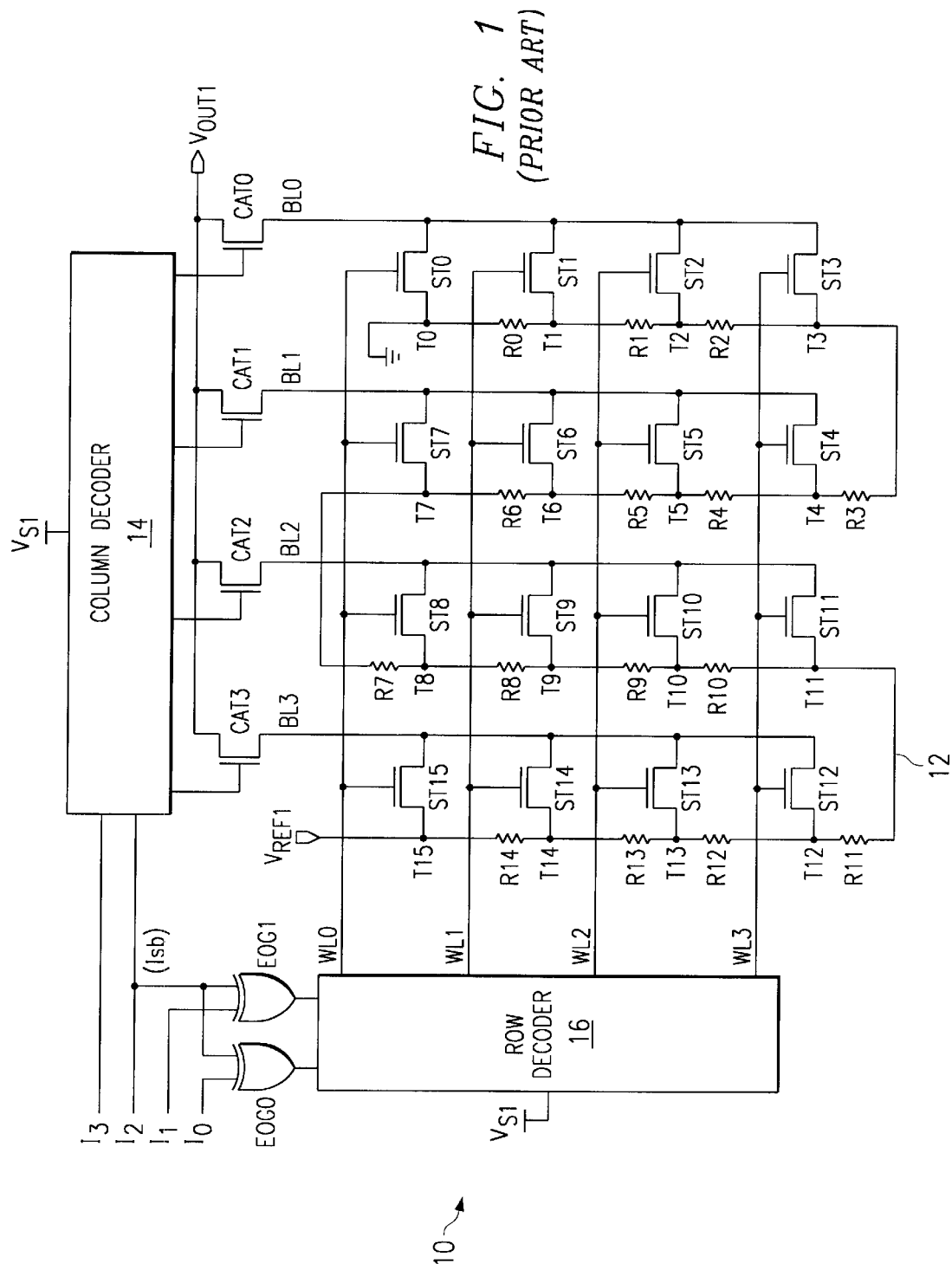
FIG. 1 illustrates a schematic of a prior art digital-to-analog converter ("DAC").

FIG. 1 was described in the preceding Background Of The Invention section of this document and in connection with the prior art.

Figure 2:
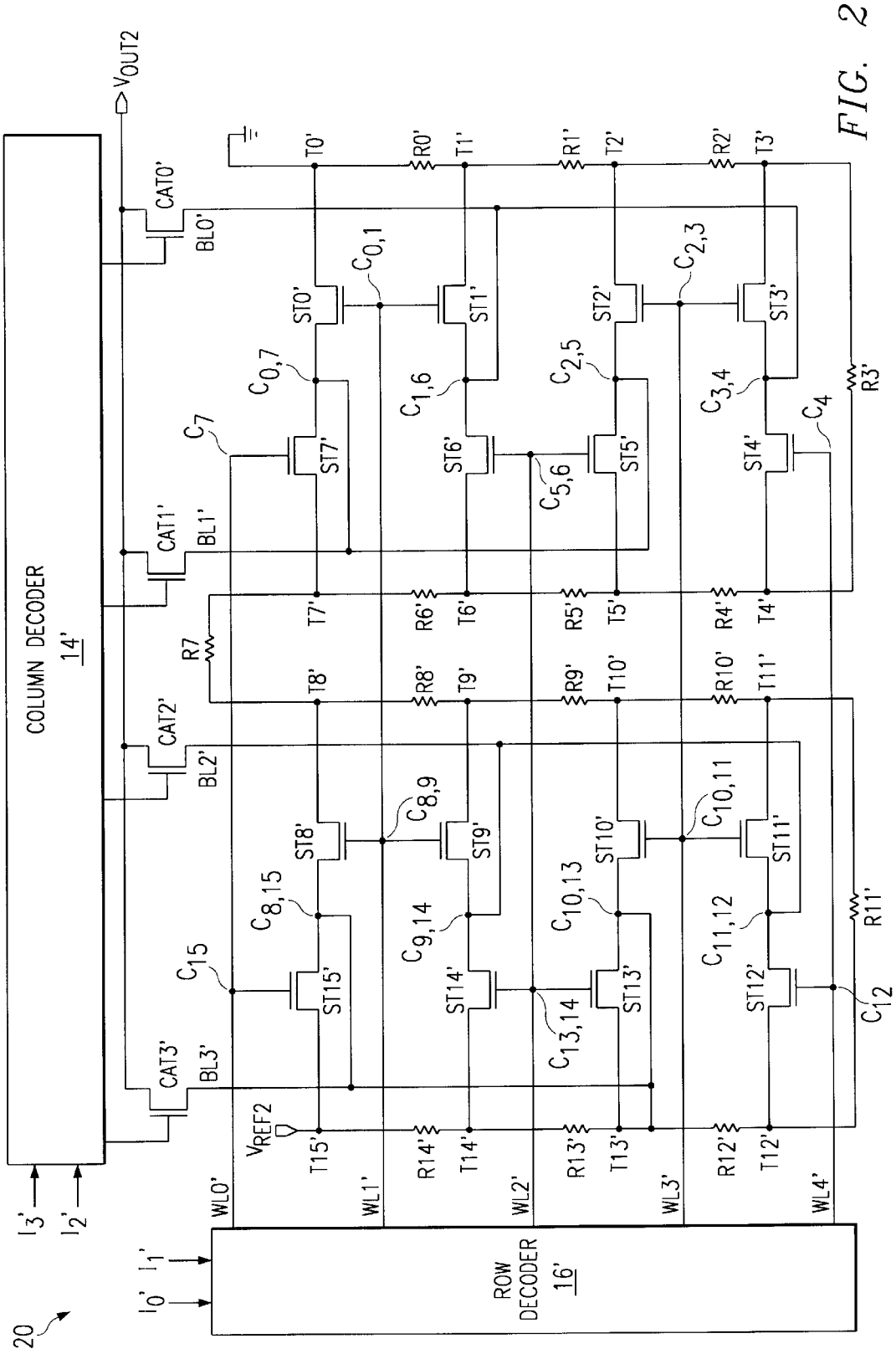
FIG. 2 illustrates a schematic of an inventive DAC including a resistor string, where the majority of the cells within the DAC include four access transistors, and where two of those transistors are controlled by a common word line.

FIG. 2 illustrates a schematic of a DAC 20 according to a preferred embodiment. DAC 20 includes some components that are schematically comparable in some respects to components in DAC 10 of FIG. 1, but as detailed below there are also various differences in various of such components in the preferred embodiments. In any event, to illustrate and introduce these components, they are shown with the same reference identifiers as in FIG. 1, with the exception that an apostrophe is added to the identifier in FIG. 2. Briefly reviewing these elements with respect to DAC 20, and assuming the reader is familiar with DAC 10, DAC 20 is a 4-to-16 DAC that receives a 4-bit input word $I_0'$–$I_3'$. DAC 20 includes a series-connected resistor string 12' which includes resistive elements R0' through R14' formed according to techniques described later, while it is noted here that each element preferably has a like resistance. The ends of resistive elements R0' through R14' give rise to an array of corresponding taps T0' through T15', and as detailed later these taps in one preferred embodiment are formed at the same time as resistive elements R0' through R14' and no separate physical contact is required between a tap and its corresponding resistive element. String 12' is biased in total by a reference voltage $V_{REF2}$, which may be any suitable voltage (e.g., 2.0 volts). DAC 20 further includes a number of bit lines BL0' through BL3'. Each bit line is connected to a corresponding one of column access transistors CAT0' through CAT3', where each such column access transistor has a first source/drain connected to one corresponding bit line and a second source/drain connected to an output $V_{OUT2}$. DAC 20 also includes a number of word lines WL0' through WL3; however, DAC 20 includes an additional word line which, for sake of consistency in identifiers, is referred to as word line WL4.' Word lines WL0' through WL4' are connected to sets of switching transistors, as further described below.

Turning now to a first item of contrast between DAC 20 and DAC 10 of the prior art, note that the schematic illustrations of FIGS. 1 and 2 are also intended to illustrate the array layouts as pertaining to switching transistors. Further in this regard, DAC 20 includes various switching transistors, which are preferably n-channel field effect transistors. In the preferred embodiment, and in contrast to the prior art, the switching transistors of DAC 20 are connected in pairs between corresponding pairs of taps. For example, such a switching transistor pair is shown relative to taps T0' and T7'; more particularly, switching transistor ST0' has a first source/drain connected to tap T0', switching transistor ST7' has a first source/drain connected to tap T7', and a second source/drain of switching transistor ST0' is connected to a second source/drain of switching transistor ST7'. As demonstrated below, in one preferred embodiment each of these electrical connections (i.e., between two switching transistors and by each transistor to a corresponding tap) is achieved by forming a mutual device region and does not require a separate physical connection. Having demonstrated these electrical connections by way of example, Table 1 below illustrates all pairs of switching transistors and the corresponding taps to which each source/drain of each transistor in the pair is connected.

TABLE 1

| Switching transistor pair | Tap connection | Tap connection |
| --- | --- | --- |
| ST0', ST7' | ST0' to T0' | ST7' to T7' |
| ST1', ST6' | ST1' to T1' | ST6' to T6' |
| ST2', ST5' | ST2' to T2' | ST5' to T5' |
| ST3', ST4' | ST3' to T3' | ST4' to T4' |
| ST11', ST12' | ST11' to T11' | ST12' to T12' |
| ST13', ST10' | ST13' to T13' | ST10' to T10' |
| ST14', ST9' | ST14' to T14' | ST9' to T9' |
| ST15', ST8' | ST15' to T15' | ST8' to T8' |

As a second item of contrast between DAC 20 and DAC 10 of the prior art, each switching transistor in a pair, in addition to being electrically connected to one another, is both physically and electrically connected to one of bit lines BL0' through BL3' via a corresponding contact. For example, for the switching transistor pair between taps T0' and T7' (i.e., switching transistors ST0' and ST7'), the second source/drain of each is connected via a contact $C_{0,7}$ to bit line BL1'. Note for sake of reference that the subscripts used for this contact, as well as the other comparable contacts discussed in this document, identify the switching transistor(s) to which the contact is connected (i.e., to the gate of the transistor). Having demonstrated this connection by way of example, Table 2 below illustrates all pairs of switching transistors and the corresponding bit lines to which the second source/drain of each transistor in the pair is connected via a contact.

TABLE 2

| Switching transistor pair | Contact connection |
| --- | --- |
| ST0', ST7' | $C_{0,7}$ to bit line Bl1' |
| ST1', ST6' | $C_{1,6}$ to bit line BL0' |
| ST2', ST5' | $C_{2,5}$ to bit line BL1' |
| ST3', ST4' | $C_{3,4}$ to bit line BL0' |
| ST11', ST12' | $C_{11,12}$ to bit line BL2' |
| ST13', ST10' | $C_{13,10}$ to bit line BL3' |
| ST14', ST9' | $C_{9,14}$ to bit line BL2' |
| ST15', ST8' | $C_{8,15}$ to bit line BL3' |

As a third item of contrast between DAC 20 and DAC 10 of the prior art, the majority of word lines connect to the gates of two switching transistors per cell, where a first of the switching transistors is on one side of the word line while a second of the switching transistors is on an opposite side of the word line. This aspect is further appreciated by now detailing the specific connections of the word lines, and is appreciated in yet additional detail later with respect to subsequent Figures illustrating the layout of a single cell. For each of word lines WL1', WL2', and WL3', that is, for those word lines that are not on the upper or lower perimeter of the DAC array, they are shown to have the connections described immediately above. For example, in one cell word line WL1' is connected to the gate of switching transistor ST8' above the word line and to switching transistor ST9' below the word line; to further illustrate this connection and to demonstrate a layout aspect shown later, this connection is via a contact $C_{8,9}$, where again subscripts are used in the reference to identify the switching transistors to which the contact is connected (i.e., to the gates of those transistors). Similarly, in another cell word line WL1' has a contact $C_{0,1}$ connected to the gate of switching transistor ST0' above the word line and to switching transistor ST1' below the word line. Looking to word line WL2', it has a contact $C_{13,14}$ connected to the gates of switching transistors ST13' and ST14' located on opposite sides of that word line, and it also has a contact $C_{5,6}$ connected to the gates of switching transistors ST5' and ST6' where those transistors again are on opposite sides of the word line. Word line WL3' is shown to have comparable connections given its contact $C_{10,11}$ connected to the gates of switching transistors ST10' and ST11', and its contact $C_{2,3}$ connected to the gates of switching transistors ST2' and ST3'. Lastly, it is noted that the illustration only includes a total of five word lines; however, for a larger DAC which includes a greater number of word lines, then the preferred implementation as applied to such a DAC will result in more than three word lines being connected in the fashion just-described with respect to word lines WL1', WL2', and WL3'.

As yet another item of contrast between DAC 20 and DAC 10 of the prior art and as introduced in part in the preceding discussion, the word lines in DAC 20 that are on the upper and lower perimeter of the DAC array connect to the gate of only a single switching transistor per cell. For example, at the top of the array of DAC 20 is word line WL0', and it connects via a contact $C_{15}$ to the gate of switching transistor ST15' in one array cell and via a contact $C_7$ to the gate of switching transistor ST7' in another array cell. Similarly, at the bottom of the array of DAC 20 is word line WL4', and it connects via a contact $C_{12}$ to the gate of switching transistor ST12' in one array cell and via a contact $C_4$ to the gate of switching transistor ST4' in another array cell.

Another item of contrast between DAC 20 and DAC 10 of the prior art is detailed later relating to the preferred embodiment for forming resistive elements R0' through R14', but is introduced now given the general layout of those elements. More particularly, in DAC 20 string 12' serpentines back and forth to form a meander having a number of columns that are primarily in the vertical dimension, with horizontal portions referred to as "turns" connecting each column of resistive elements. Further, although the majority of resistive elements are shown schematically in a vertical sense in FIG. 2, note that due to the formation of those elements as detailed below that some resistive elements will be formed at least in part in a turn that extends in the horizontal dimension. Also due to the layout having a majority of elements in the vertical dimension, the voltage swing sampled to a bit line from any set of resistive elements aligned in the vertical dimension is only a fraction of the total bias voltage (e.g., of $V_{REF2}$), whereas if the resistive elements were aligned horizontally then the voltage swing would be much greater, thereby increasing device loading.

As a final item of contrast between DAC 20 and DAC 10 of the prior art, the location of the paired switching transistors among the string meander lends itself to a more compact design as detailed later, thereby reducing the overall complexity and size of DAC 20 and gaining the benefits as known in the art which accompany the reduction in device size. In addition and as detailed later, in one preferred embodiment resistive elements R0' through R14' are formed as diffusion devices, thereby reducing overall power consumption. Still further, this choice also furthers a preferred layout because the resistive elements may then be formed in the same plane as the switching transistors. Lastly, note that the symmetry of DAC 20 is such that once a cell geometry is defined, it may be repeated for virtually all sets of taps and corresponding switching transistors in DAC 20, although some cells may require additional considerations by one skilled in the art such as those relating to a turn in meander 12'.

The operation of DAC 20 is comparable in various respects to that of DAC 10 described earlier and, thus, is reviewed here with a lesser level of detail given the previous explanation of FIG. 1. Thus, decoders 14' and 16' respond to bits $I_0'$–$I_3'$ of the digital input word; in this regard, however, note that the different layout of DAC 20 may cause one skilled in the art to create different types of decoding methodologies for column decoder 14' and row decoder 16' and, indeed, for this reason, the additional logic gates shown in FIG. 1 are not shown in FIG. 2. In any event, in response to a digital input word, one word line is asserted thereby enabling the switching transistors having their gate connected to that word line. Consequently, each enabled switching transistor provides a conductive path between the tap connected to the first source/drain of the switching transistor and the contact connected to the second source/drain of the switching transistor. The contact connection thereby connects the tap voltage to one of the bit lines BL0' through BL3'. Thus, during an overlapping time period, column decoder 14' enables one of column access transistors CAT0' through CAT3' and the enabled one of those transistors passes the voltage along its corresponding bit line to $V_{OUT2}$. To accomplish these operations, one skilled in the art may select various alternative circuit configurations for both column decoder 14' and row decoder 16'.

The operation of DAC 20 described above is now explored by way of an example, followed by an additional Table that demonstrates the operation for accessing any of voltage taps T0' through T15'. By way of example, assume that a 4-bit input word $I_0'$–$I_3'$ is presented to access tap T7'. As a result, row decoder 16' decodes bits $I_0'$ and $I_1'$ so that word line WL0' is asserted. In response, switching transistor ST7' is enabled (as is switching transistor ST15'). Consequently, switching transistor ST7 provides a conductive path from tap T7' to contact $C_{0,7}$, and further therefore to bit line BL1'. Next, column decoder 14' decodes bits $I_2'$ and $I_3'$ so that column access transistor CAT1' is enabled. In response, therefore, a conductive path is provided from bit line BL1' to $V_{OUT2}$, thereby passing the voltage from tap T7' to $V_{OUT2}$. Thus, this example should further explain the operation of DAC 20, which is further demonstrated in the following Table 3 which depicts for each voltage tap the combination of asserted word line and selected bit line to pass the voltage on a given tap to $V_{OUT2}$.

TABLE 3

| Voltage tap | Asserted word line | Selected bit line |
|---|---|---|
| T0' | WL1' | BL1' |
| T1' | WL1' | BL0' |
| T2' | WL3' | BL1' |
| T3' | WL3' | BL0' |
| T4' | WL4' | BL0' |
| T5' | WL2' | BL1' |
| T6' | WL2' | BL0' |
| T7' | WL0' | BL1' |
| T8' | WL1' | BL3' |
| T9' | WL1' | BL2' |
| T10' | WL3' | BL3' |
| T11' | WL3' | BL2' |
| T12' | SL4' | BL2' |
| T13' | WL2' | BL3' |
| T14' | WL2' | BL2' |
| T15' | WL0' | BL3' |

Figure 3A:
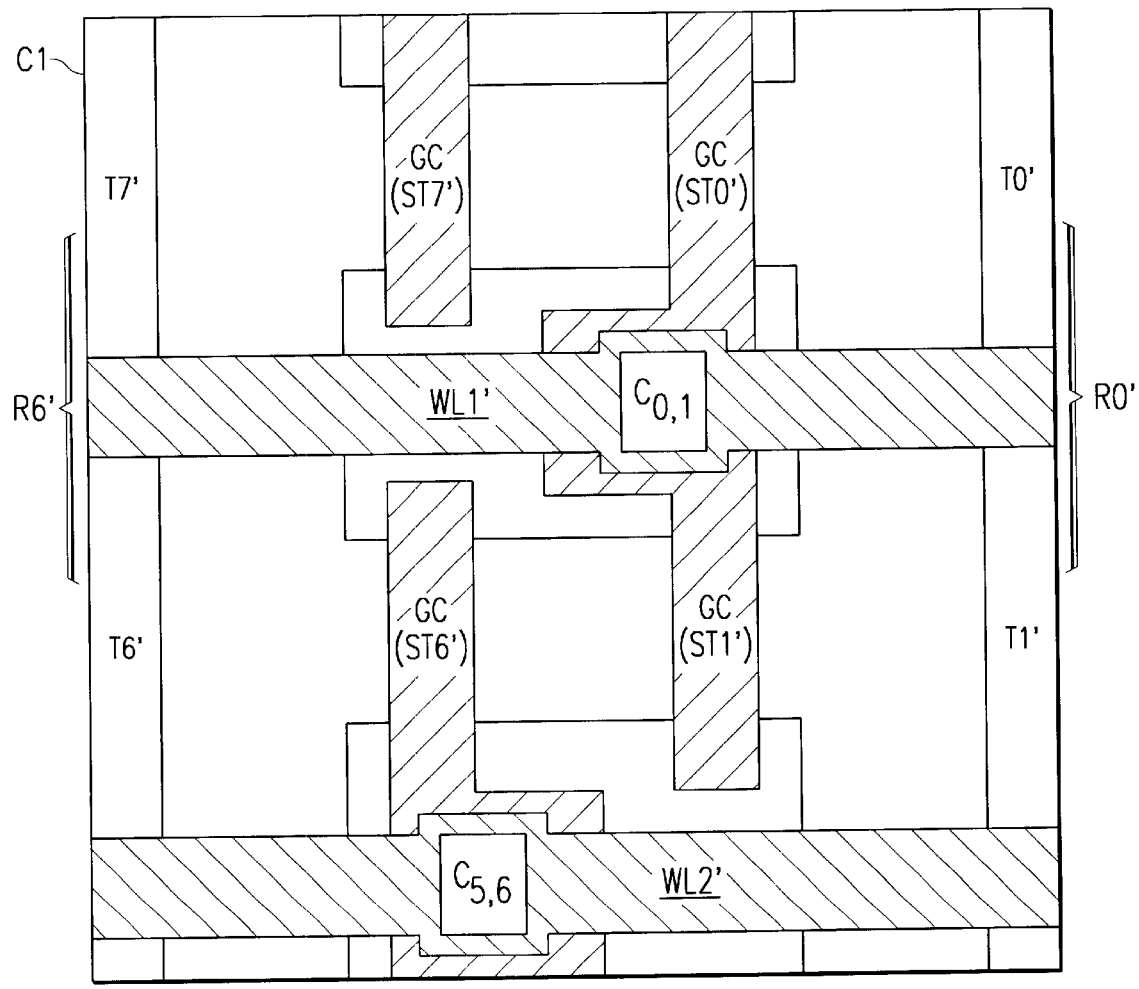
FIG. 3a illustrates a plan view of a cell from the DAC of FIG. 2 according to a first embodiment.
Figure 3B:
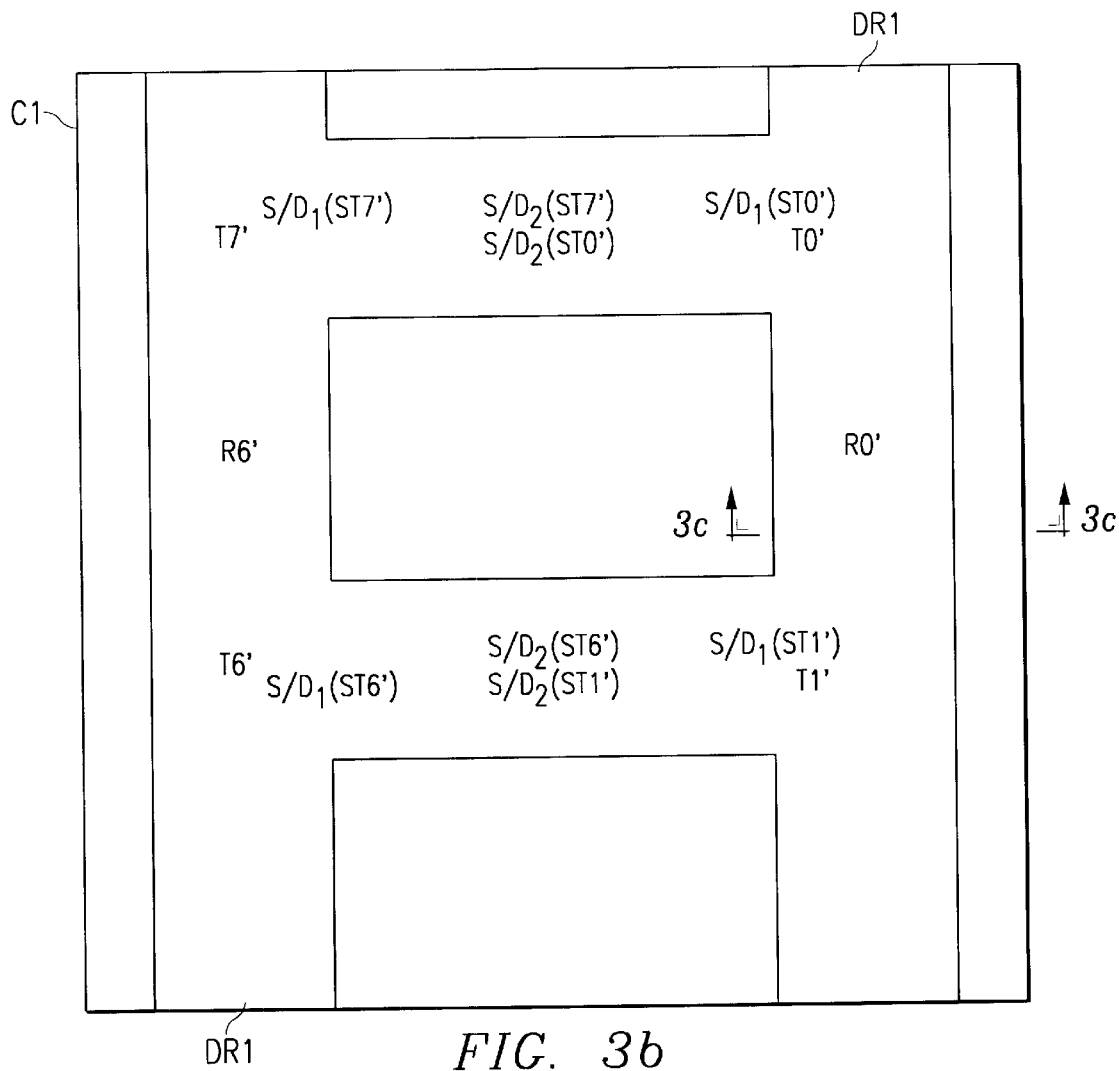
Figure 3C:
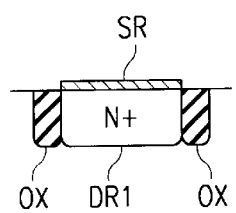
Figure 3D:
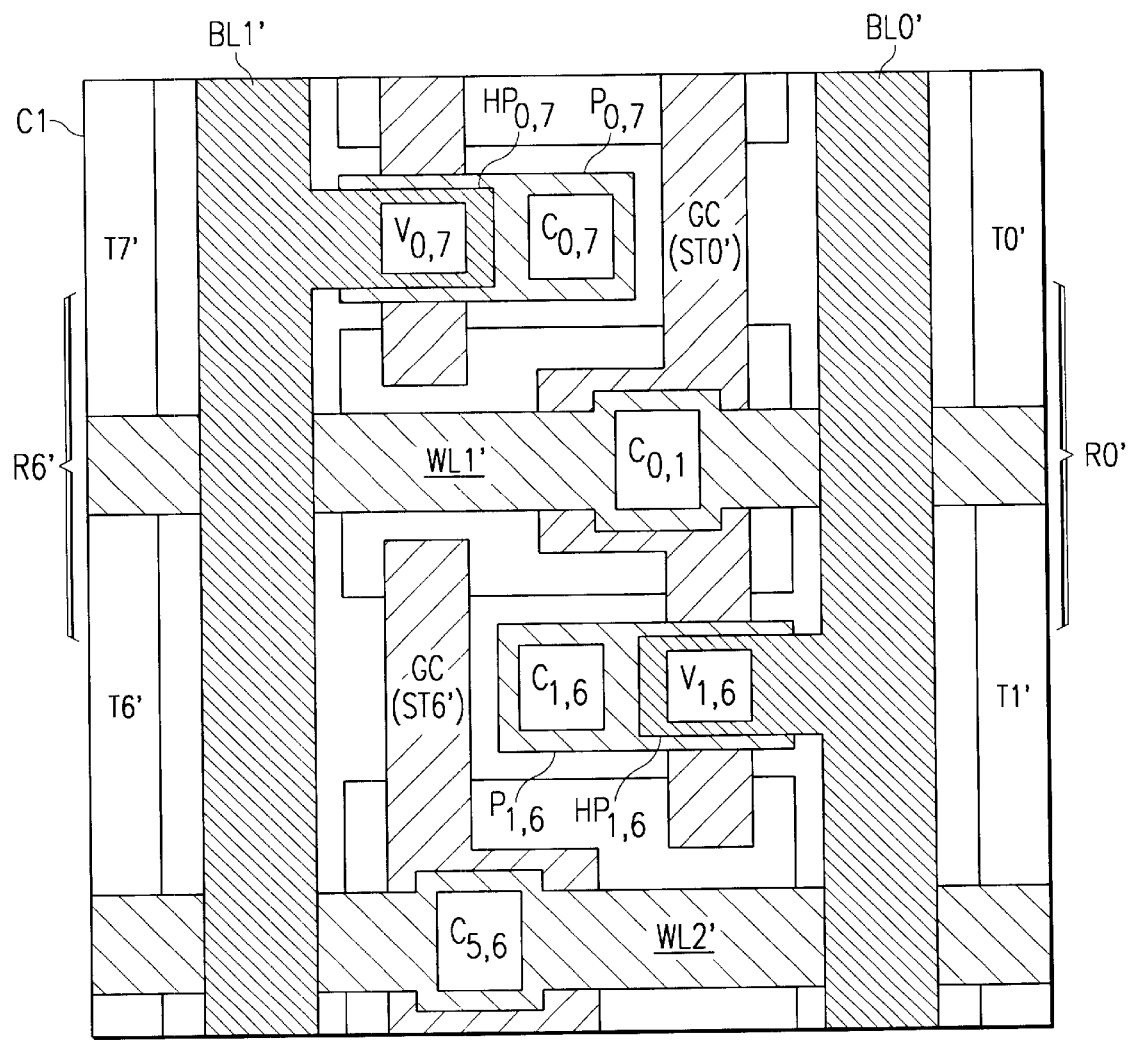
FIG. 3d illustrates the plan view of the cell in FIG. 3a with additional components to demonstrate additional connections.

FIG. 3a illustrates a plan view of a cell C1 to be repeated such that it forms one of numerous cells in DAC 20 and to further demonstrate the preferred and compact design according to the preferred embodiment; further, FIGS. 3b through 3d illustrate related views to further depict this design. Turning first then to FIG. 3a, its illustration includes the DAC cell that includes resistive elements R0' and R6'; thus, FIG. 3a further illustrates taps T0' and T7' at the top of these resistive elements and taps T1' and T6' at the bottom of these resistive elements. Additional aspects of FIG. 3a such as the switching transistors and word lines are discussed later, but first attention is directed to the formation of the resistive elements, as is further appreciated by examining FIG. 3b.

FIG. 3b illustrates the same plan perspective as FIG. 3a, but before various manufacturing steps are complete in order to focus on a lower plane of the device. More particularly, FIG. 3b illustrates a plan view of a diffusion region designated generally as DR1, where in the preferred embodiment region DR1 is formed by diffusing N+ dopants into a semiconductor device such as a semiconductor substrate. In an alternative embodiment, however, region DR1 could be formed as a p-type diffusion region (in an appropriate well or semiconductor substrate). In any event, by forming region DR1, it forms the eventual regions for various different devices or device components, including resistive elements R0' and R6'. Moreover, FIG. 3c illustrates a cross-sectional view of either resistive element R0' or R6'. From the FIG. 3c perspective, region DR1 forms the width of a resistive element, and in the preferred embodiment is isolated on both sides by forming oxide regions OX in trenches adjacent each side of the resistive element, where such a formation is achieved using shallow trench technology. The shallow trench technology is preferred because it assists in maintaining a uniform width for each resistive element and, in doing so, thereby increases the chance of maintaining the same resistance value for each of those elements. This may be in contrast to other isolating technologies, such as LOCOS, where lateral encroachment leads to reduced diffusion surface width and may make resistor matching more difficult. Lastly with respect to FIG. 3c, note that a silicide region SR is shown over diffusion region DR1. In the preferred embodiment, such a region may be formed to further reduce the resistance of the resistive element (as well as the others) in which case the majority of the current passing through the device will pass through region SR.

Looking to the remainder of FIG. 3b, region DR1 also forms other device components. More particularly, in the horizontal dimension region DR1 defines the source/drain regions for the switching transistors formed relative to resistive elements R0' and R6'. Specifically, recall it was noted earlier that in the preferred embodiment the resistive elements are formed in the same plane as the switching transistors. This same plane is defined by diffusion region DR1. Similarly, the area at the top of resistive element R0', which may be electrically referred to as tap T0', also provides a first source/drain $S/D_1$ for switching transistor ST0'. Similarly, the area at the bottom of resistive element R0', which may be electrically referred to as tap T1', also provides a first source/drain $S/D_1$ for switching transistor ST1'. Similar observations may be made with respect to resistive element R6'. Thus, the area at the top of resistive element R6' is electrically tap T7' and provides a first source/drain $S/D_1$ for switching transistor ST7', while the area at the bottom of resistive element R6' (i.e., electrically tap T6') provides a first source/drain $S/D_1$ for switching transistor ST6'.

Continuing with FIG. 3b, diffusion region DR1 also forms the second source/drain regions for the switching transistors described in the preceding paragraph. Thus, between taps T0' and T7' there is a mutual area of diffusion which forms the second source/drain $S/D_2$ for switching transistor ST7' and which also forms the second source/drain $S/D_2$ for switching transistor ST0'. Indeed, at this point attention is returned to FIG. 3a and it may be seen that a gate conductor GC(ST7') is formed vertically between source/drain regions $S/D_1(ST7')$ and $S/D_2(ST7')$. Thus, this combination of gate conductor and source/drain regions (as well as an insulator below the gate, but not seen from the figure's perspective) form switching transistor ST7' shown schematically in FIG. 2. Indeed, a similar layout is shown for the other three switching transistors formed by diffusion region DR1 in FIG. 3b, and given the added gate conductors in FIG. 3a. Thus, gate conductor GC(ST0') combines with source/drain regions $S/D_2(ST0')$ and $S/D_1(ST0')$ to form switching transistor ST0', gate conductor GC(ST6') combines with source/drain regions $S/D_2(ST6')$ and $S/D_1(ST6')$ to form switching transistor ST6', and gate conductor GC(ST1') combines with source/drain regions $S/D_2(ST1')$ and $S/D_1(ST1')$ to form switching transistor ST1'.

Having demonstrated the location of the resistive elements, taps, and switching transistors in FIGS. 3a and 3b, the remaining illustrations in FIG. 3a are now explored. First, note that the above-described gate conductors are preferably formed in a polysilicon layer overlying diffusion region DR1, with an oxide (not shown) layer formed between the two. Next, an additional insulator layer (not shown) is formed over the polysilicon layer, and then a first metal layer is patterned, where typically in the art such a layer is referred to as metal-1. In the preferred embodiment the metal-1 layer is formed to create the word lines for DAC 20, and in FIG. 3a word lines WL1' and WL2' are shown from this layer. Next, metal contacts are formed for DAC 20 and, more particularly in FIG. 3a, two such contacts $C_{0,1}$ and $C_{5,6}$ are shown. Recall from FIG. 2 that these contacts connect the gates of switching transistors to the appropriate word line. For example, contact $C_{0,1}$ in FIG. 3a connects word line WL1' to the gate conductors beneath it, namely, to gate conductor GC(ST0') and gate conductor GC(ST1'). As the other example illustrated in FIG. 3a, contact $C_{5,6}$ in FIG. 3a connects word line WL2' to the gate conductor beneath it, namely, to gate conductor GC(ST6'). Finally in this regard, note that due to the cell boundaries as illustrated in FIG. 3a, certain other like connections are not shown. For example, gate conductor GC(ST7') of FIG. 3a is connected to word line WL0' as shown in FIG. 2, but this connection is not shown in FIG. 3a although it is achieved in a manner comparable to the contacts shown in FIG. 3a. As another example, while contact $C_{5,6}$ in FIG. 3a is shown to connect to gate conductor GC(ST6') for switching transistor ST6', it also connects to a gate conductor for switching transistor ST5', but again that connection is not shown in FIG. 3a given the boundary of cell C1.

Given the layout illustrations and discussion thus far, note two additional observations with respect to the switching transistors in the preferred embodiment. As a first observation, note that a portion of a diffused area in diffusion region DR1 which forms an end of a resistive element is effectively a shared diffusion region in that it also provides a source/drain for a switching transistor (e.g., T0' and $S/D_1$(ST0')). Accordingly, this shared region further reduces the size of each cell and, hence, the size of the DAC. As a second observation, note that a mutual diffusion area forms a source/drain for two different switching transistors (e.g., $S/D_2$(ST7') and $S/D_2$(ST0')). As a result of this latter aspect, there are various benefits. For example, no additional electrical contact is required between these two source/drains to achieve the electrical communication required by the schematic of FIG. 2. In addition, capacitance is reduced. Still further, the cell size is reduced as compared to a configuration where each switching transistor requires an independent area to form its source/drain. As a final observation, since diffusion region DR1 forms both the resistive elements and the potential conductive paths for the switching transistors, each end of a resistive element, that is, each DAC tap, is also connected in this manner to a source/drain of its corresponding switching transistor without requiring an additional component to make this connection. Once more, therefore, such an approach reduces device complexity as well as device size.

FIG. 3d illustrates the same plan perspective as FIG. 3a, but after additional manufacturing steps are complete in order to illustrate the complete device cell C1. More particularly, FIG. 3d illustrates the preferred layout to complete the remaining electrical connections shown for the cells in FIG. 2 and not discussed above in FIGS. 3a and 3b. First, note that FIG. 3d shows the addition of bit lines BL0' and BL1'. In the preferred embodiment, an additional insulator layer (not shown) is formed over the metal-1 layer, and then a second metal layer (i.e., metal-2) is patterned to form bit lines BL0' and Bl1'. Generally, bit lines BL0' and Bl1' are vertically disposed above diffusion region DR1. However, as detailed below, the bit lines also include short horizontal portions to facilitate the remaining required electrical connections discussed earlier with respect to FIG. 2.

To discuss the remaining aspects of FIG. 3d, attention is directed by way of example to switching transistors ST0' and ST7' as shown in FIGS. 3a, 3b, and 3d. Specifically, at the same time the metal-1 layer is used to form word lines WL1' and WL2', it is also patterned to form a pad $P_{0,7}$. Two aspects are now noted with respect to the location of pad $P_{0,7}$. First, pad $P_{0,7}$ overlies the mutual source drain regions of switching transistors ST0' and ST7' (i.e., $S/D_2$(ST0') and $S/D_2$(ST7')). This location permits a contact $C_{0,7}$ to be formed to electrically connect pad $P_{0,7}$ to those mutual source/drain regions. Contact $C_{0,7}$, as shown in FIG. 2, permits the connection, therefore, of these mutual source/drain regions to bit line BL1'. Completing this connection leads to a second aspect of pad $P_{0,7}$, namely, note that it extends in the direction of bit line BL1'. In addition, bit line BL1' includes a relatively short horizontal portion $HP_{0,7}$ that extends in the direction of pad $P_{0,7}$ and, indeed, horizontal portion $HP_{0,7}$ in the metal-2 layer overlies pad $P_{0,7}$ in the metal-1 layer. Finally, note that an electrical via contact $V_{0,7}$ is shown in horizontal portion $HP_{0,7}$, thereby electrically connecting it to the underlying pad $P_{0,7}$ in the metal-1 layer. From these connections, therefore, note that pad $P_{0,7}$ connects the mutual source/drain regions of switching transistors ST0' and ST7' to pad $P_{0,7}$, and pad $P_{0,7}$ is connected by via contact $V_{0,7}$ to bit line BL1'. Thus, as shown in Table 3, above, either tap T0' or T7' may be electrically accessed by bit line BL1' by enabling either switching transistor ST0' or ST7', respectively. Finally, having demonstrated these various aspects with respect to switching transistor ST0' and ST7', similar observations may be made with respect to switching transistor ST1' and ST6'. Particularly, a metal-1 layer pad $P_{1,6}$ is formed over the mutual source/drain regions of switching transistor ST1' and ST6' and is electrically connected to those regions by a contact $C_{1,6}$, and a metal-2 horizontal portion $HP_{1,6}$ of bit line BL0' overlies pad $P_{1,6}$ and is electrically connected thereto by an electrical via contact $V_{1,6}$. As a result and as also shown in Table 3, above, tap T1' or T6' may be electrically accessed by bit line BL0' by enabling either switching transistor ST1' or ST6', respectively.

Figure 4:
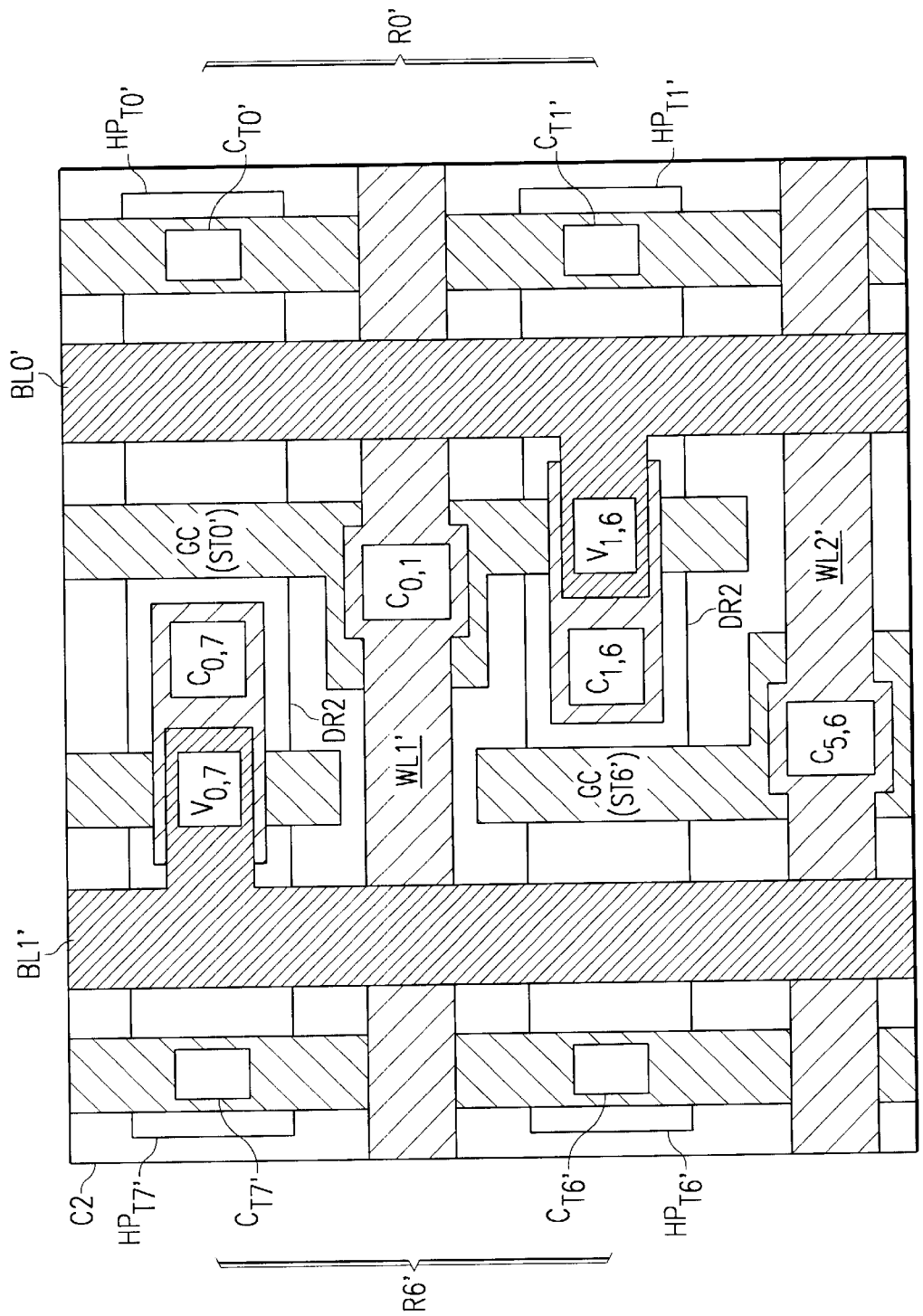
FIG. 4 illustrates a plan view of a partially fabricated cell from the DAC of FIG. 2 according to a second embodiment.

FIG. 4 illustrates a plan view of an alternative embodiment for a cell C2 to be used in of DAC 20 and which permits the use of a different material for the resistive elements. Specifically, recall that FIGS. 3a through 3d illustrated a preferred embodiment which implements resistive elements formed in a diffusion region DR1. The alternative embodiment of FIG. 4 shares various aspects with that of FIGS. 3a through 3d, but permits connection to a resistive element of a different type. Looking now to the common aspects, the cell of FIG. 4 includes a diffusion region DR2 to form switching transistors that are oriented in the same manner with respect to each of the gate conductors, word lines, bit lines with horizontal portions, contacts to switching transistor source/drain regions, and via contacts shown in FIG. 3d. However, in this alternative embodiment, note that diffusion region DR2 does not include resistive elements. Instead, these elements may be formed in a different manner, as further discussed below.

Examining the resistive elements and connections to those elements in FIG. 4, note that diffusion region DR2 includes horizontal portions extending generally outward from the cell in a manner to connect to corresponding resistive elements. For example, along the left of FIG. 4, diffusion region DR2 includes a horizontal portion $HP_{T7'}$ and a horizontal portion $HP_{T6'}$. Given the reach of these portions, the cell further includes a resistive element R6', but in this embodiment resistive element R6' is formed in the polysilicon layer at the same time as the gate conductors. Moreover, because resistive element R6' is not formed in the same layer as the switching transistors, then an additional contact is required to connect each tap to a source/drain of a switching transistor; as examples, a contact $C_{T7'}$ connects one end of resistive element R6' to a source/drain region of switching transistor ST7', and a contact $C_{T6'}$ connects an opposite end of resistive element R6' to a source/drain region of switching transistor ST6'. Finally with respect to FIG. 4, note that the use of horizontal portions of diffusion region DR2 could permit connection to yet other types of resistive elements. In all such cases, however, note that while there is increased flexibility in choice of resistive material, there is a tradeoff in that device size is increased and additional contacts are required.

From the above, it may be appreciated that the present embodiments provide numerous advantages over the prior art, many of which have been set forth above and additional ones of which will be ascertained by one skilled in the art. For example, the preferred configurations may apply either to DACs or ADCs. In addition, while the present embodiments have been described in detail, various substitutions, modifications or alterations could be made to the descriptions set forth above without departing from the inventive scope. Indeed, some of these type of variations have been set forth above, and still others may be ascertained. For example, while resistor strings with relatively small numbers of resistors have been illustrated, the present teachings apply equally if not more beneficially to strings with larger numbers of resistors. Thus, the preceding as well as other ascertainable examples should further illustrate the inventive scope, where that scope is defined by the following claims.

What is claimed is:

1. A data converter, comprising:
   an input for receiving a digital word;
   an output for providing an analog voltage level in response to the digital word;
   a plurality of bit lines formed with an alignment in a first dimension;
   a plurality of word lines formed with an alignment in a second dimension different than the first dimension;
   a string comprising a plurality of series connected resistive elements, wherein the string comprises a plurality of voltage taps, and wherein at least a majority of the plurality of series connected resistive elements are formed with an alignment in the first dimension; and
   a plurality of switching transistors coupled between the plurality of voltage taps and the output, wherein for each of a majority of the plurality of word lines each word line is coupled to at least one gate of a switching transistor located on a first side of the word line and to at least one gate of a switching transistor located on a second side of the word line, wherein the second side is opposite the first side.

2. The data converter of claim 1:
   wherein the data converter comprises a plurality of cells; and
   wherein each cell in a majority of the cells comprises a group of four of the switching transistors and two of the resistive elements.

3. The data converter of claim 2:
   wherein the group of four of the switching transistors comprises a first pair of switching transistors;
   wherein a first transistor in the first pair has a first source/drain coupled to a first one of the plurality of voltage taps; and
   wherein a second transistor in the first pair has a first source/drain coupled to a second one of the plurality of voltage taps and a second source/drain coupled to a second source/drain of the first transistor in the first pair.

4. The data converter of claim 3:
   wherein the group of four of the switching transistors further comprises a second pair of switching transistors;
   wherein a first transistor in the second pair has a first source/drain coupled to a third one of the plurality of voltage taps; and
   wherein a second transistor in the second pair has a first source/drain coupled to a fourth one of the plurality of voltage taps and a second source/drain coupled to a second source/drain of the first transistor in the second pair.

5. The data converter of claim 4 wherein the first and second source/drain of the first and second transistor in the first pair and of the first and second transistor in the second pair are formed in a diffusion region.

6. The data converter of claim 5 wherein the first and second source/drain of the first and second transistor in the first pair and of the first and second transistor in the second pair are formed with an aligrunent in the second dimension.

7. The data converter of claim 5:
   wherein the second source/drain for the first transistor in the first pair is formed in a first diffusion region shared with the second source/drain of the second transistor in the first pair; and
   wherein the second source/drain for the first transistor in the second pair is formed in a second diffusion region shared with the second source/drain of the second transistor in the second pair.

8. The data converter of claim 7 wherein the first and second source/drain of the first and second transistor in the first pair and of the first and second transistor in the second pair are formed with an alignment in the second dimension.

9. The data converter of claim 7 wherein each of the plurality of series connected resistive elements are formed in the diffusion region.

10. The data converter of claim 9 wherein the first and second source/drain of the first and second transistor in the first pair and of the first and second transistor in the second pair are formed with an alignment in the second dimension.

11. The data converter of claim 9:
   wherein a first transistor in the first pair has a first source/drain coupled by a mutual region in the diffusion region to a first one of the plurality of voltage taps; and
   wherein a second transistor in the first pair has a first source/drain coupled by a mutual region in the diffusion region to a second one of the plurality of voltage taps.

12. The data converter of claim 11 wherein the first and second source/drain of the first and second transistor in the first pair and of the first and second transistor in the second pair are formed with an alignment in the second dimension.

13. The data converter of claim 11:
wherein the first diffusion region is coupled to a first of the plurality of bit lines; and
wherein the second diffusion region is coupled to a second of the plurality of bit lines.

14. The data converter of claim 11:
wherein the first diffusion region is coupled to a first of the plurality of bit lines by a first pair of contacts; and
wherein the second diffusion region is coupled to a second of the plurality of bit lines by a second pair of contacts.

15. The data converter of claim 14 wherein for each of a majority of the word lines the word line is coupled by a single contact to at least one gate of a switching transistor located on a first side of the word line and to at least one gate of a switching transistor located on a second side of the word line, wherein the second side is opposite the first side.

16. The data converter of claim 5 wherein the diffusion region comprises an N type semiconductor diffusion region.

17. The data converter of claim 1 wherein the second dimension is orthogonal to the first dimension.

18. The data converter of claim 1 wherein each of the plurality of series connected resistive elements are formed in a diffusion region.

19. The data converter of claim 1 wherein each of the plurality of series connected resistive elements are formed in a polysilicon region.

20. The data converter of claim 19 wherein each of the plurality of switching transistors has a first and second source/drain region formed in a diffusion region.

21. A method of forming a data converter, comprising the steps of:

forming an input for receiving a digital word;

forming an output for providing an analog voltage level in response to the digital word;

forming a plurality of bit lines formed with an alignment in a first dimension;

forming a plurality of word lines formed with an alignment in a second dimension different than the first dimension;

forming a string comprising a plurality of series connected resistive elements, wherein the string comprises a plurality of voltage taps, and wherein at least a majority of the plurality of series connected resistive elements are formed with an alignment in the first dimension; and forming a plurality of switching transistors coupled between the plurality of voltage taps and the output, wherein for each of a majority of the plurality of word lines each word line is coupled to at least one gate of a switching transistor located on a first side of the word line and to at least one gate of a switching transistor located on a second side of the word line, wherein the second side is opposite the first side.

* * * * *